United States Patent [19]

Hayashi

[11] Patent Number: 5,523,625
[45] Date of Patent: Jun. 4, 1996

[54] SEMICONDUCTOR INTEGRATED CIRCUIT DEVICE HAVING PARTIALLY CONSTRICTED LOWER WIRING FOR PREVENTING UPPER WIRINGS FROM SHORT-CIRCUIT

[75] Inventor: Mituharu Hayashi, Tokyo, Japan

[73] Assignee: NEC Corporation, Tokyo, Japan

[21] Appl. No.: 325,054

[22] Filed: Oct. 19, 1994

[30] Foreign Application Priority Data

Oct. 22, 1993 [JP] Japan .................... 5-287720

[51] Int. Cl.⁶ .................... H01L 21/3205; H01L 21/88
[52] U.S. Cl. .................... 257/758; 257/776; 257/775; 257/756
[58] Field of Search .................... 257/758, 756, 257/775, 776

[56] References Cited

U.S. PATENT DOCUMENTS

| | | |
|---|---|---|
| 4,605,470 | 8/1986 | Gwozdz et al. .................... 257/775 |
| 4,774,561 | 9/1988 | Takagi .................... 257/756 |
| 5,296,742 | 3/1994 | Sakai .................... 257/758 |

FOREIGN PATENT DOCUMENTS

| | | | |
|---|---|---|---|
| 0125847 | 7/1983 | Japan | .................... 257/758 |
| 0122751 | 7/1983 | Japan | .................... 257/758 |
| 0046853 | 10/1983 | Japan | .................... 257/758 |
| 0178641 | 9/1985 | Japan | .................... 257/758 |
| 0243343 | 10/1987 | Japan | .................... 257/758 |
| 2-30180 | 7/1990 | Japan | . |
| 0261023 | 9/1992 | Japan | .................... 257/758 |

*Primary Examiner*—Rolf Hille
*Assistant Examiner*—Alexander Oscar Williams

[57] ABSTRACT

A semiconductor integrated circuit device has upper wirings extending on an inter-level insulating layer covering a lower wiring at spacing with zig-zag side surfaces between the upper wirings, and the zig-zag lines are transferred to the inter-level insulating layer so as to prevent the upper wirings from short circuit due to a residue of conductive material for the upper wirings.

1 Claim, 5 Drawing Sheets

5,523,625

SEMICONDUCTOR INTEGRATED CIRCUIT DEVICE HAVING PARTIALLY CONSTRICTED LOWER WIRING FOR PREVENTING UPPER WIRINGS FROM SHORT-CIRCUIT

FIELD OF THE INVENTION

This invention relates to a semiconductor integrated circuit device and, more particularly, to a semiconductor integrated circuit device having a multi-level wiring structure.

DESCRIPTION OF THE RELATED ARTS

The multi-level wiring structure is desirable for a semiconductor integrated circuit device, because a larger amount of real estate of the semiconductor substrate is available for circuit components of the integrated circuit.

FIG. 1 illustrates a typical example of the multi-level wiring structure fabricated over a semiconductor substrate 1. A lowest insulating layer 1 such as a field oxide layer is grown over a part of the semiconductor substrate 1, and a lower wiring 3 extends on the lowest insulating layer 1. The lower wiring 3 is uniform in width, and does not have a constriction.

The lower wiring 3 is covered with an inter-level insulating layer 4, and the inter-level insulating layer 4 is topographical to the lower wiring 3. On the inter-level insulating layer 4, two upper wirings 5a and 5b extend in parallel across the lower wiring 3. The upper wirings 5a and 5b are also uniform in width, and do not have a constriction.

When the integration density was not so large as currently available semiconductor integrated circuit devices, the prior art multi-level wiring structure shown in FIG. 1 was conducive to the improvement of the integration density. However, the circuit components of a semiconductor integrated circuit device have been miniaturized, and, accordingly, the wirings have become narrower. An isotropical etching technique was employed in the patterning stages for the wirings, and sharply patterned the multi-level wiring structure.

The lower wiring 3 is patterned through the anisotropical etching, and the side surfaces are substantially vertical. When the inter-level insulating layer 4 is deposited over the lower wiring 3, the sharp edges of the lower wiring 3 are transferred to the inter-level insulating layer 4, and the inter-level insulating layer 4 in turn transfers the sharp edges to a conductive layer deposited over the inter-level insulating layer 4 for the upper wirings 5a and 5b.

In this situation, when the conductive layer is patterned through the anisotropical etching into the upper wirings 5a and 5b, a residue 6 of the conductive material tends to be left along the sharp edges of the inter-level insulating layer 4. If the upper wirings 5a and 5b are close to each other, the residue 6 short-circuits the upper wirings 5a and 5b, and decreases the production yield.

Japanese Patent Publication of Examined Application No. 2-30180 proposes to partially constrict upper wirings. FIG. 2 illustrates the prior art multi-level wiring structure, and the prior art multi-level wiring structure is fabricated on a semiconductor substrate 11 partially covered with a lowest insulating layer 12. Lower wirings 13a and 13b extend in parallel on the lowest insulating layer 12, and are uniform in width. The lower wirings 13a and 13b are patterned through an anisotropical etching, and the anisotropical etching forms sharp side edges 13c, 13d, 13e and 13f of the lower wirings 13a and 13b.

An inter-level insulating layer 14 covers the lower wirings 13a and 13b, and the sharp edges 13c to 13f are transferred to the inter-level insulating layer 14. Step-portions are formed in the inter-level insulating layer 14 along the side edges 13d and 13e. Upper wirings 15a and 15b extend on the inter-level insulating layer 14 across the lower wirings 13a and 13b, and are partially constricted over the step-portions of the inter-level insulating layer 14. Namely, set-back portions 15c, 15d, 15e and 15f are formed in the side edges of the upper wirings 15a and 15b opposed to each other, and prolong the side surfaces of the upper wirings 15a and 15b between the side edges 13d and 13e of the lower wirings 13a and 13b.

The set-back portions 15c to 15f are equivalent to an increased distance between the upper wirings 15a and 15b, and a residue of conductive material hardly bridges the prolonged distance.

However, a problem is encountered in the semiconductor integrated circuit device in that the upper wiring 15a short-circuits the upper wiring 15b if the upper wirings 15a and 15b become further closer.

Notches are formed in the upper wirings 15a and 15b of the prior art semiconductor integrated circuit device through a lithographic process, and the resolution of the lithographic process sets a limit on the line width. If the upper wirings 15a and 15b have the minimum line width, the notches are never formed in the upper wirings. In other words, the set-back portions 15c to 15f are formed in the upper wirings 15a and 15b insofar as they are wider than the minimum line width.

Moreover, when the upper wirings 15a and 15b are designed to have low resistance, the upper wirings 15a and 15b are wider than the minimum line width. However, the set-back portions 15c to 15f increase the resistance, and are not desirable for the low-resistive wirings.

SUMMARY OF THE INVENTION

It is therefore an important object of the present invention to provide a semiconductor integrated circuit device which is free from short-circuit.

To accomplish the object, the present invention proposes to partially constrict a lower wiring for prolong a side edge along a step-portion of an inter-level insulating layer.

In accordance with the present invention, there is provided a semiconductor integrated circuit device fabricated on a semiconductor substrate, comprising: a) a lower insulating layer provided over a major surface of the semiconductor substrate; b) a lower wiring extending on the lower insulating layer, and having a first portion having side surfaces straightly extending, a second portion having side surfaces straightly extending and a third portion having side surfaces bent for merging with the side surfaces of the first portion and the side surfaces of the second portion; c) an inter-level insulating layer conformally covering the lower insulating layer and an exposed area of the lower wiring; d) a first upper wiring extending on the inter-level insulating layer across the first portion of the lower wiring; and e) a second upper wiring extending on the inter-level insulating layer across the second portion of the lower wiring.

BRIEF DESCRIPTION OF THE DRAWINGS

The features and advantages of the semiconductor integrated circuit device according to the present invention will be more clearly understood from the following description taken in conjunction with the accompanying drawings in which.

DESCRIPTION OF THE PREFERRED EMBODIMENTS

First Embodiment

Figure 1:
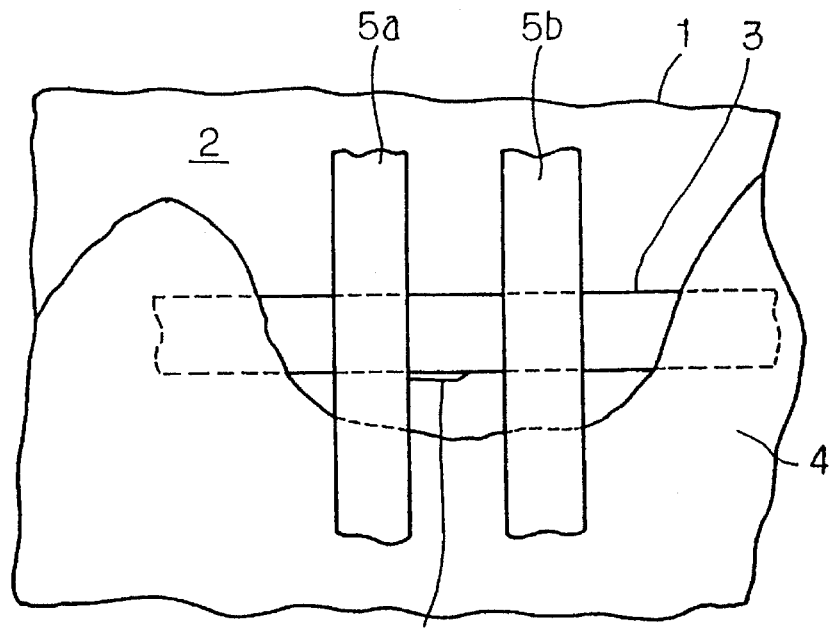
FIG. 1 is a plan view showing the prior art multi-level wiring structure.
Figure 2:
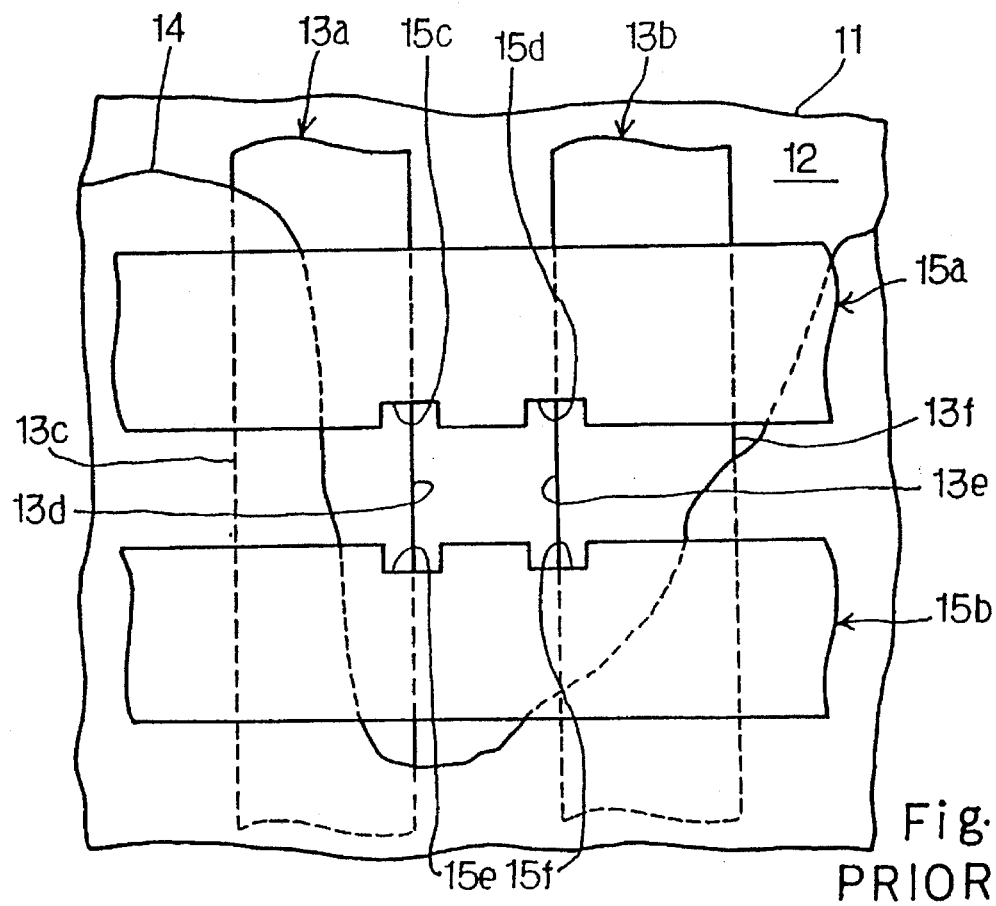
FIG. 2 is a plan view showing the prior art multi-level wiring structure disclosed in Japanese Patent Publication of Examined Application No. 2-30180.
Figure 3:
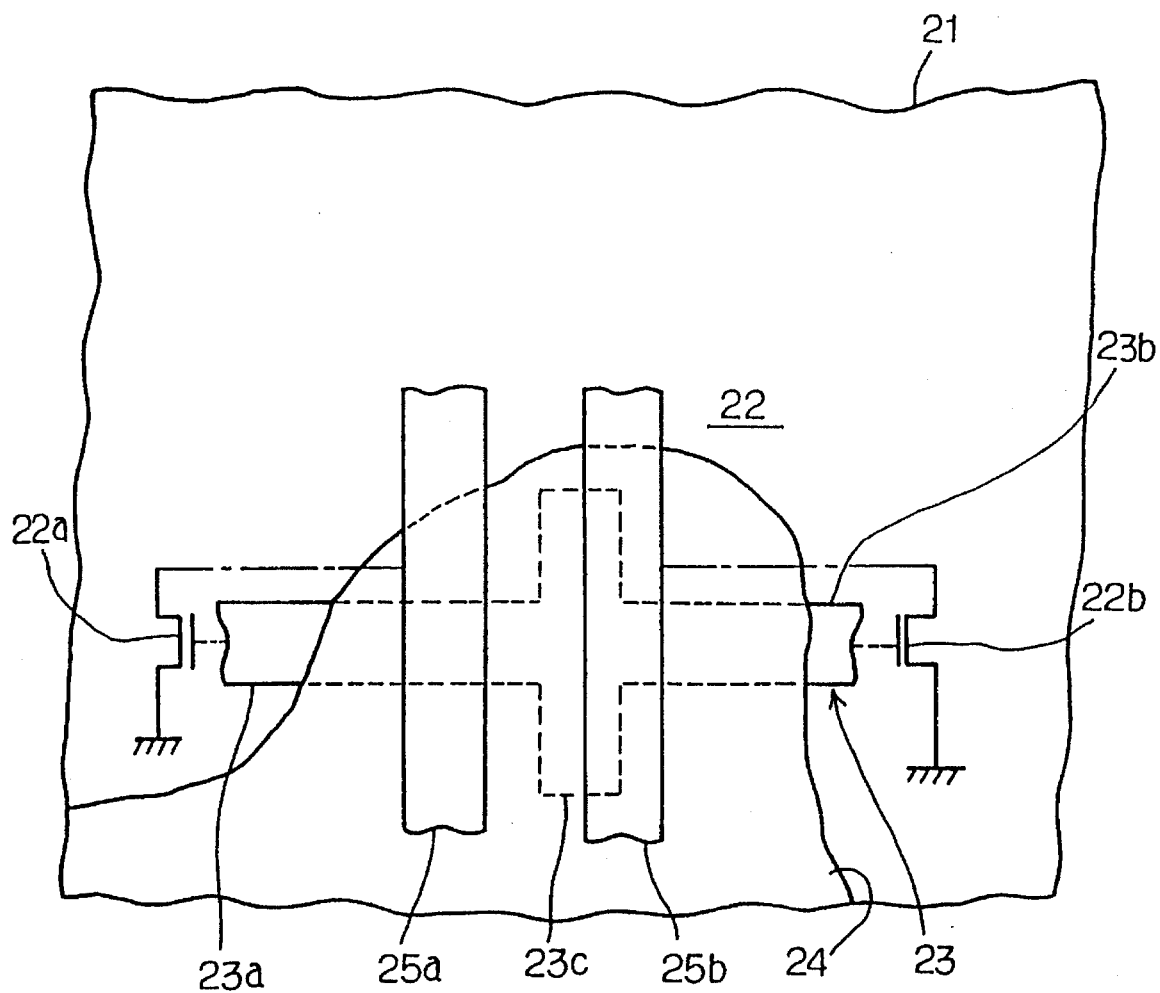
FIG. 3 is a plan view showing a semiconductor integrated circuit device according to the present invention.

Referring to FIG. 3 of the drawings, a semiconductor integrated circuit embodying the present invention is fabricated on a semiconductor substrate 21, and field effect transistors 22a and 22b and a multi-level wiring structure are incorporated in the semiconductor integrated circuit. In FIG. 3, an inter-level insulating film structure is partially removed for exposing the multi-level wiring structure.

The semiconductor substrate 21 is partially covered with a lowest insulating layer 22, and the lowest insulating layer 22 is implemented by a field oxide layer in this instance.

A lower wiring 23 extends on the lowest insulating layer 22, and has a narrow portion 23a electrically connected to the gate electrode of the field effect transistor 22a, a narrow portion 23b electrically connected to the gate electrode of the field effect transistor 22b and a wide portion 23c merged with the narrow portions 23a and 23b.

An inter-level insulating layer 24 covers the lower wiring 23, and is partially removed for exposing parts of the narrow portions 23a and 23b. The inter-level insulating layer 24 is conformal, and the step formed between the upper surface and the side surfaces of the lower wiring 23 is transferred to the inter-level insulating layer 24, and a step portion is formed in the inter-level insulating layer 24.

Two upper wirings 25a and 25b extend on the inter-level insulating layer 24, and are electrically connected to the drain nodes of the field effect transistors 22a and 22b, respectively. The upper wiring 25a extends across the narrow portion 23a, and the upper wiring 25b extends across the wide portion 23c of the lower wiring 23. Therefore, a gap between the upper wirings 25a and 25b exposes the step portion of the inter-level insulating layer 24 along the wide portion 23c and the narrow portion 23a, and the exposed step portion of the inter-level insulating layer 24 is longer than the gap between the upper wirings 25a and 25b.

Even if a residue of conductive material of the upper wirings 25a and 25b is left at the step-portion of the inter-level insulating layer 24, the residue does not short-circuit the upper wirings 25a and 25b, because the bent step portion of the inter-level insulating layer 24 is equivalent to a increased gap between the upper wirings 25a and 25b.

The multi-level wiring structure is fabricated as follows. First, the semiconductor substrate 21 is prepared, and the lowest insulating layer or the thick field oxide layer is selectively grown on the major surface of the semiconductor substrate 21. The lowest insulating layer 22 defines active areas (not shown), and impurity regions are formed in the active areas for the circuit components such as the field effect transistors 22a and 22b. Conductive material such as, for example, polysilicon is deposited over the entire surface of the structure, and is patterned into the lower wirings such as the lower wiring 23c by using an anisotropical etching. The lower wirings have wide portions 23c at intervals.

Figure 4A:
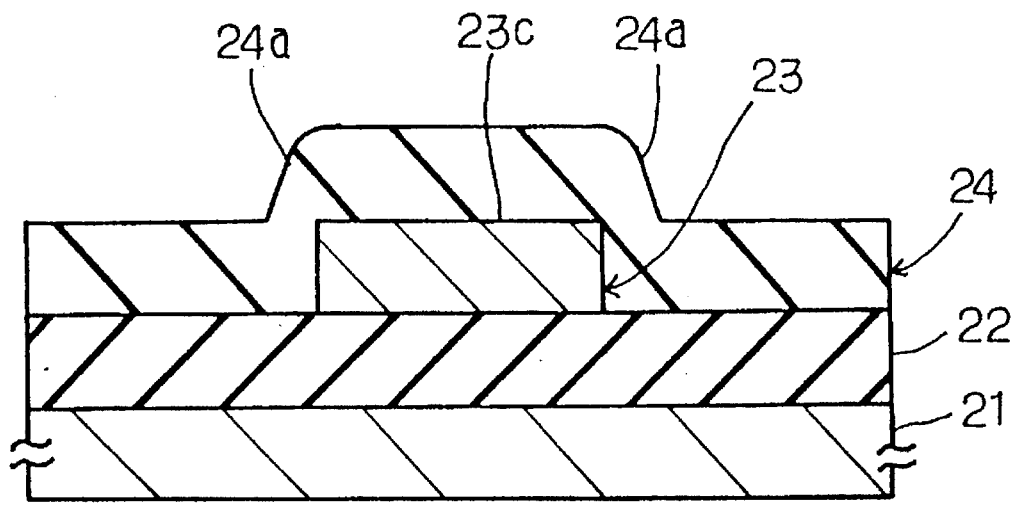
FIGS. 4A to 4D are cross sectional view showing a process of patterning an upper wiring according to the present invention.

Insulating substance such as silicon oxide is conformally deposited over the entire surface of the structure, and forms the inter-level insulating layer 24. The steps formed between the upper surface and the side surfaces of the wiring 23 are transferred to the inter-level insulating layer 24, and the step portions 24a are formed in the inter-level insulating layer 24 along the step portion of the lower wiring 23 as shown in FIG. 4A.

Figure 4B:
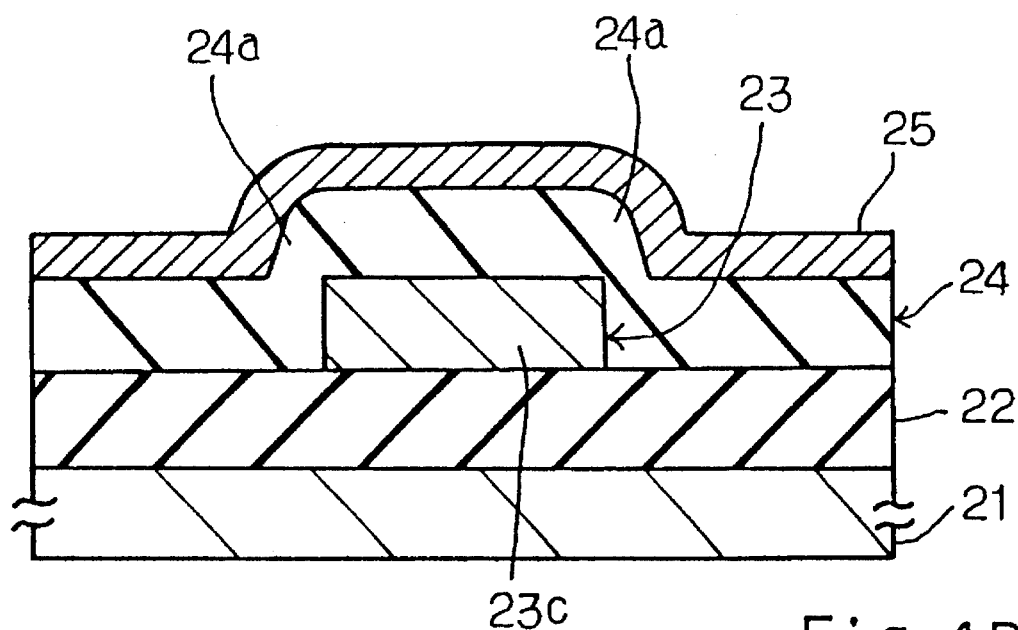

Conductive material such as polysilicon is deposited over the entire surface of the inter-level insulating layer 24, and forms a conductive layer 25 as shown in FIG. 4B.

Figure 4C:
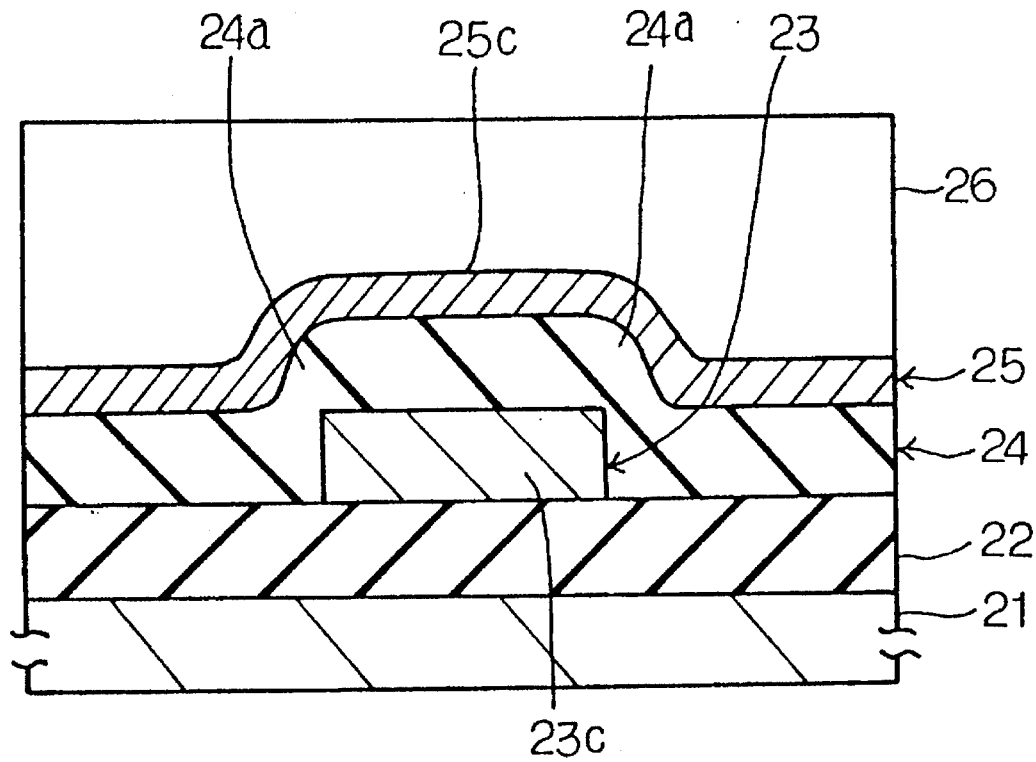
Figure 4D:
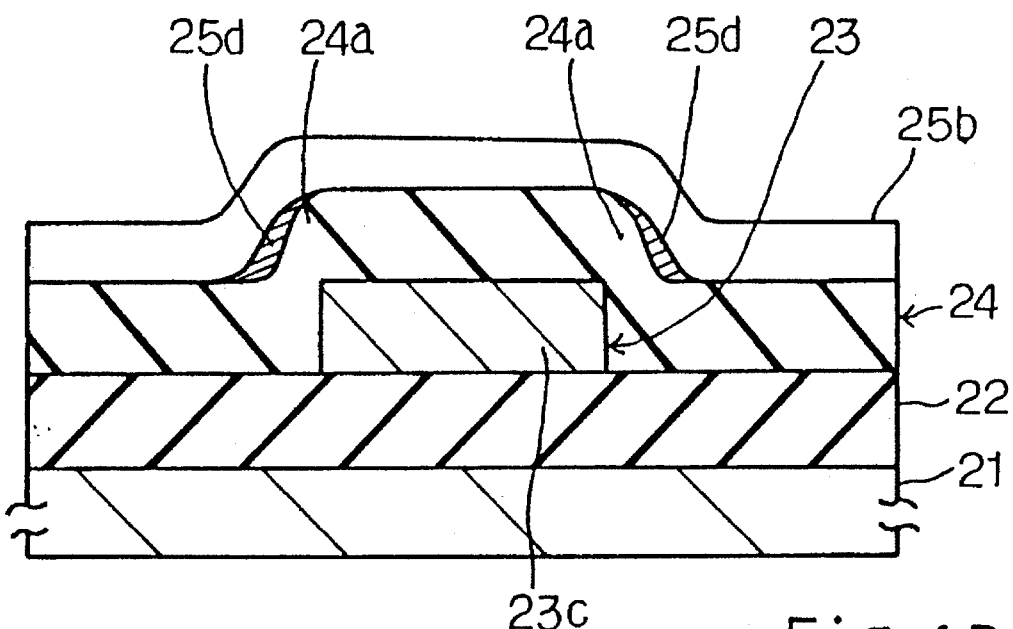

Photo-resist solution is spun onto the entire surface of the conductive layer 25, and is patterned into a photo-resist mask 26 through a lithographic process. The photo-resist mask 26 selectively exposes the conductive layer 25, and reference 25c designates a part of conductive layer 25 over the wide portion 23c close to the boundary between the narrow portion 23a and the wide portion 23c. The resultant structure is illustrated in FIG. 4C.

Using the photo-resist mask 26, the anisotropical etching removes the exposed portion 25c of the conductive layer 25, and the upper wirings 25a and 25b are patterned on the inter-level insulating layer 24. Even if residues 25d of the conductive material are left on the step portions 24a, the residues 25d hardly short-circuit the upper wirings 25a and 25b, because the prolonged boundary between the narrow portion 23a and the wide portion 23c is equivalent to an increased gap between the upper wirings 25a and 25b.

Although the upper wirings 25a and 25b are covered with a passivation layer, the passivation layer is not shown in the drawings.

As will be understood from the foregoing description, the partially bent lower wiring 23 prolongs the step-portions 24a of the inter-level insulating layer 24, and prevents the upper wirings 25a and 25b from short-circuit.

Second Embodiment

Figure 5:
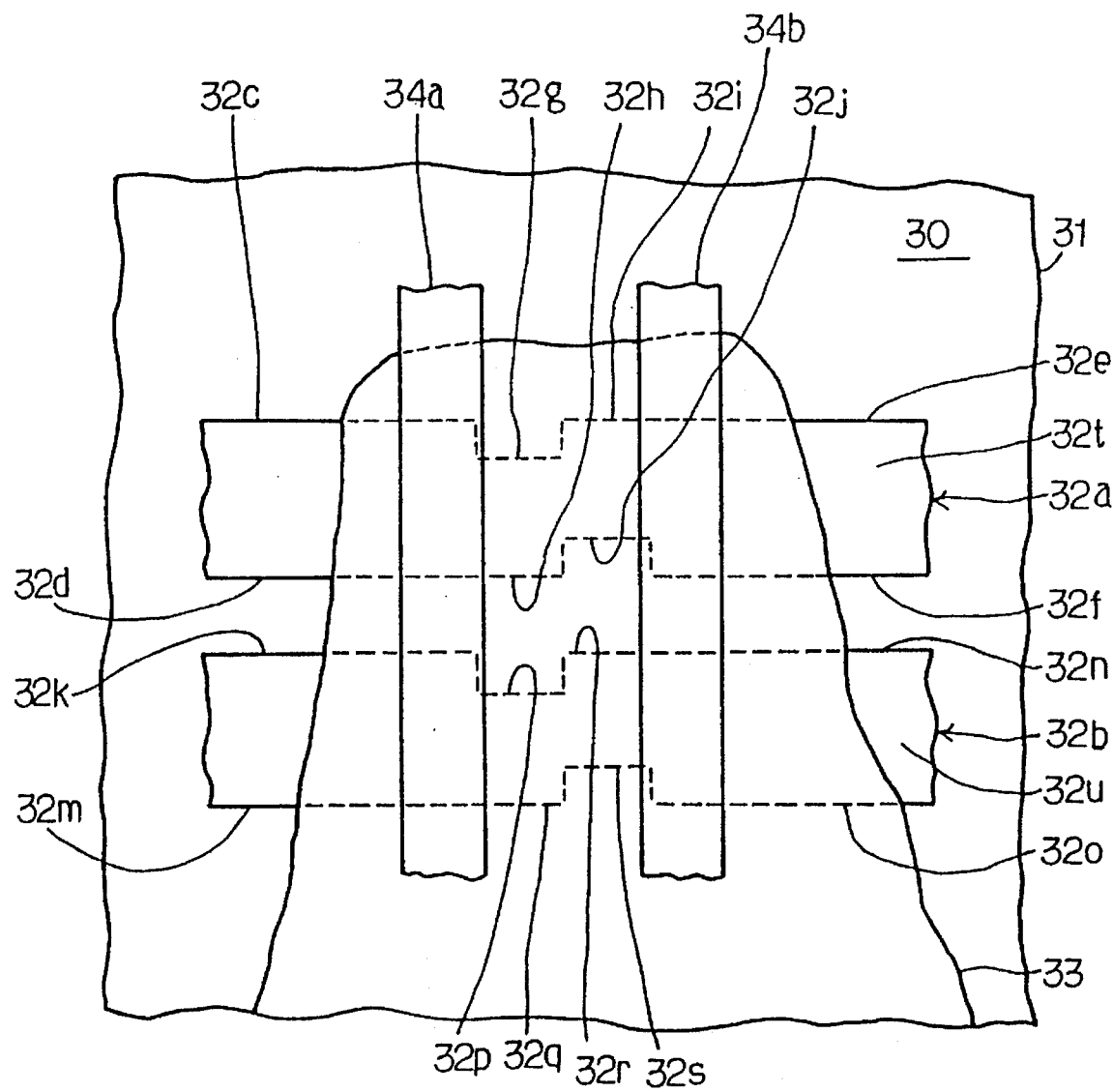
FIG. 5 is a plan view showing another semiconductor integrated circuit device according to the present invention.

Turning to FIG. 5 of the drawings, another semiconductor integrated circuit device embodying the present invention is fabricated on a lower insulating layer 30 laminated over a semiconductor substrate 31.

Lower wirings 32a and 32b are patterned on the lower insulating layer 30. The lower wiring 32a has wide portions having side surfaces 32c/32d and 32e/32f and narrow portions having side surfaces 32g/32h and 32i/32j. The side surface 32g is set back from the side surfaces 32c, 32i and 32e, and the side surface 32h is aligned with the side surfaces 32d and 32f. The side surface 32j is set back from the side surfaces 32d, 32h and 32f, and the side surfaces 32c to 32j are arranged in zig-zag. The lower wiring 32b also has wide portions having side surfaces 32k/32m and 32n/32o and narrow portions having side surfaces 32p/32q and 32r/32s. The side surface 32p is set back from the side surfaces 32k, 32r and 32n, and the side surface 32q is aligned with the side surfaces 32m and 32o. The side surface 32s is set back from the side surfaces 32m, 32q and 32o, and the side surfaces 32k to 32s are arranged in zig-zag. The side surfaces 32c to 32j and 32k to 32s form zig-zag step portions together with upper surfaces 32t and 32u.

The lower wirings 32a and 32b are covered with an inter-level insulating layer 33, and the zig-zag step portions are transferred to the inter-level insulating layer 33.

Upper wirings 34a and 34b are patterned on the inter-level insulating layer 33. The upper wiring 34a extends over the boundary between the wide portion and the narrow portion on the left side, and the other upper wiring 34b extends over the boundary between the wide portion and the narrow portion on the right side. Therefore, the zig-zag step-portions along the side surfaces 32g/32h, 32h/32j, 32p/32r and 32q/32s are exposed to a gap between the upper wirings 34a and 34b, and are equivalent to an increased gap between the upper wirings 34a and 34b.

Although the upper wirings 34a and 34b are covered with a passivation layer, the passivation layer is removed from the semiconductor integrated circuit device, and the inter-level insulating layer 33 is partially removed for exposing the multi-level wiring structure.

The lower wiring 23 needs a wide vacant area for the wide portion 23c. However, the lower wirings 32a and 32b can be arranged close to each other.

Although particular embodiments of the present invention have been shown and described, it will be obvious to those skilled in the art that various changes and modifications may be made without departing from the spirit and scope of the present invention.

What is claimed is:

1. A semiconductor integrated circuit device fabricated on a semiconductor substrate, comprising:

a) a lower insulating layer provided over a major surface of said semiconductor substrate;

b) a lower wiring extending on said lower insulating layer, and including a wide portion having a first side surface on one side thereof and a second side surface on the opposite side to said one side, a first narrow portion having a third side surface straightly merged with said first side surface and a fourth side surface forming a first step with said second side surface and a second narrow portion having a fifth side surface forming a second step with said third side surface and a sixth side surface forming a third step with said fourth side surface;

c) an inter-level insulating layer conformally covering said lower insulating layer and said lower wiring;

d) a first upper wiring extending on said inter-level insulating layer across said first narrow portion of said lower wiring; and e) a second upper wiring extending on said inter-level insulating layer across said second narrow portion of said lower wiring.

* * * * *